United States Patent
Yan et al.

(10) Patent No.: US 9,570,338 B2
(45) Date of Patent: Feb. 14, 2017

(54) METHOD FOR FORMING ISOLATION MEMBER IN TRENCH OF SEMICONDUCTOR SUBSTRATE

(71) Applicant: Semiconductor Manufacturing International (Shanghai) Corporation, Shanghai (CN)

(72) Inventors: Yan Yan, Shanghai (CN); Jun Yang, Shanghai (CN)

(73) Assignee: SEMICONDUCTOR MANUFACTURING INTERNATIONAL (SHANGHAI) CORPORATION (CN)

(*) Notice: Subject to any disclaimer, the term of this patent is extended or adjusted under 35 U.S.C. 154(b) by 0 days.

(21) Appl. No.: 14/703,181

(22) Filed: May 4, 2015

(65) Prior Publication Data
US 2015/0348829 A1    Dec. 3, 2015

(30) Foreign Application Priority Data
May 28, 2014    (CN) .......................... 2014 1 0231071

(51) Int. Cl.
*H01L 21/762* (2006.01)
*H01L 21/3105* (2006.01)

(52) U.S. Cl.
CPC ... *H01L 21/76224* (2013.01); *H01L 21/31055* (2013.01)

(58) Field of Classification Search
CPC ....................................................... H01L 21/76
See application file for complete search history.

(56) References Cited

U.S. PATENT DOCUMENTS

| | | | | |
|---|---|---|---|---|
| 5,930,655 A | * | 7/1999 | Cooney, III | H01L 21/28568 257/E21.168 |
| 2009/0170321 A1 | * | 7/2009 | Cho | H01L 21/76224 438/692 |

* cited by examiner

*Primary Examiner* — Mamadou Diallo
(74) *Attorney, Agent, or Firm* — Innovation Counsel LLP

(57) ABSTRACT

A method for forming an isolation member in a trench of a substrate may include the following steps: performing a first deposition process to form a first isolation material set, which is at least partially positioned in the trench; partially removing the first isolation material set, such that a remaining portion of the first isolation material set remains in the trench; after the first isolation material set has been partially removed, performing a fluorine-reduction process on at least the remaining portion of the first isolation material set; after the fluorine-reduction process, performing a second deposition process to form a second isolation material set, which is at least partially positioned in the trench, wherein the second isolation material set includes the remaining portion of the first isolation material set; and processing the second isolation material set for forming the isolation member.

19 Claims, 7 Drawing Sheets

US 9,570,338 B2

METHOD FOR FORMING ISOLATION MEMBER IN TRENCH OF SEMICONDUCTOR SUBSTRATE

CROSS-REFERENCE TO RELATED APPLICATION

This application claims priority to and benefit of Chinese Patent Application No. 201410231071.2, filed on 28 May 2014, the Chinese Patent Application being incorporated herein by reference in its entirety.

BACKGROUND OF THE INVENTION

The present invention is related to a method for forming an isolation member in a trench of a semiconductor substrate. The resulted structure may be used for manufacturing a semiconductor device.

In a process for manufacturing a semiconductor device, a dielectric isolation member, e.g., a shallow trench isolation (STI) member, may be formed in a trench of a semiconductor substrate. The isolation member may isolate components and/or prevent electrical current leakage in the semiconductor device. In a process for forming the isolation member, a SICONI™ etching process may be performed to partially remove dielectric material that has been deposited in the trench. As a result of the SICONI™ etching process, a substantial amount of fluorine residues may remain in the trench. The fluorine residues may significantly interfere with subsequent deposition of dielectric material in the trench, such that the deposition rate for the dielectric material in the trench may be substantially low. Since the dielectric material deposition rate in the trench may be substantially lower than the dielectric material deposition rate away from the trench, dielectric material deposited away from the trench may accumulate substantially higher than dielectric material deposited in the trench; therefore, the subsequent planarization (and/or polishing) of the deposited isolation material may be substantially inefficient. As a result, the productivity associated with the isolation member and/or the semiconductor device may be unsatisfactorily.

SUMMARY

An embodiment of the present invention may be related to a method for forming an isolation member in a trench of a substrate. The substrate may be a semiconductor substrate. The resulted structure may be used for manufacturing a semiconductor device. The method may include the following steps: performing a first deposition process to form a first isolation material set, which may be at least partially positioned in the trench; partially removing the first isolation material set, such that a remaining portion of the first isolation material set may remain in the trench; after the first isolation material set has been partially removed, performing a first fluorine-reduction process on at least the remaining portion of the first isolation material set; after the first fluorine-reduction process has been performed, performing a second deposition process to form a second isolation material set, which may be at least partially positioned in the trench and may include the remaining portion of the first isolation material set; and processing the second isolation material set for forming the isolation member.

The method may include the following steps: before performing the first deposition process, performing a preliminary deposition process to form a preliminary isolation material set, which may be at least partially positioned in the trench; and before performing the first deposition process, partially removing the preliminary isolation material set, such that a remaining portion of the preliminary isolation material set may remain in the trench. The first isolation material set may include the remaining portion of the preliminary isolation material set.

The method may include the following step: before performing the first deposition process, performing a preliminary fluorine-reduction process on at least the remaining portion of the preliminary isolation material set.

The preliminary deposition process provides a first-type dielectric material. The first deposition process provides the same first-type dielectric material. The second deposition process provides the same first-type dielectric material.

The first fluorine-reduction process may include processing at least the remaining portion of the first isolation material set using ozone plasma. The ozone plasma may be provided using a power that may be in a range of 350 watts to 600 watts. The ozone plasma may be provided using a power of 450 watts. The first fluorine-reduction process may be performed for a time duration that may be in a range of 1 second to 10 seconds. The first fluorine-reduction process may be performed for 3 seconds.

The first fluorine-reduction process may include processing at least the remaining portion of the first isolation material set using hydrogen plasma.

The method may include the following step: after the first fluorine-reduction process has been performed, performing an X-ray photoelectron spectroscopy process to determine a fluorine concentration on the remaining portion of the first isolation material set.

After the first fluorine-reduction process has been performed, a fluorine concentration at a surface of the remaining portion of the first isolation material set may be less than 0.4 atom percent.

Before the second deposition process, a fluorine concentration at a surface of the remaining portion of the first isolation material set may be less than 0.4 atom percent.

The first fluorine-reduction process may reduce a fluorine concentration at a surface of the remaining portion of the first isolation material set from greater than 1.6 atom percent to less than 0.4 atom percent.

The second deposition process further may form a third isolation material set, which may be positioned away from the trench and may overlap the substrate. A difference between a height of a top surface of the third isolation material set above a bottom side of the substrate and a height of a top surface of the second isolation material set above the bottom side of the substrate may be less than or equal to 200 angstroms after the second deposition process has been completed The method may include the following step: performing a polishing process to partially remove the second isolation material set and to completely remove the third isolation material set. A remaining portion of the second isolation material set may form the isolation member.

The first isolation material set may be partially removed using a remote plasma assisted dry etching process.

The first deposition process may be a high-aspect-ratio process.

The method may include the following step: performing a polishing process to partially remove the second isolation material set, such that a remaining portion of the second isolation material set may form the isolation member. A difference between maximum isolation material height and a minimum isolation material height above a bottom side of the substrate may be less than or equal to 200 angstroms before the polishing process.

According to embodiments of the invention, in a process for forming an isolation member in a trench of a substrate, a fluorine-reduction process may be performed before an isolation material deposition process. The fluorine-reduction process may enable the isolation material deposition process to be performed efficiently and may enable a subsequent polishing process to be performed efficiently. Advantageously, satisfactory productivity associated with the isolation member (and a related semiconductor device) may be attained.

The above summary is related to some of many embodiments of the invention disclosed herein and is not intended to limit the scope of the invention.

DETAILED DESCRIPTION

Figure 1A:
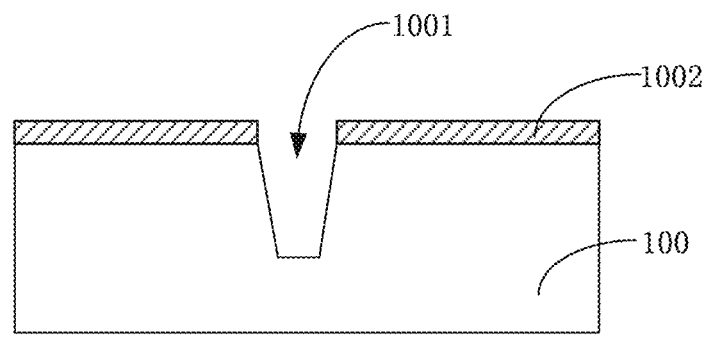
FIG. 1A, FIG. 1B, FIG. 1C, FIG. 1D, FIG. 1E, FIG. 1F, FIG. 1G, and FIG. 1H show schematic diagrams (e.g., schematic cross-sectional views) that illustrate elements and/or structures formed in a method for forming an isolation member in a trench of a substrate in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

Figure 2:
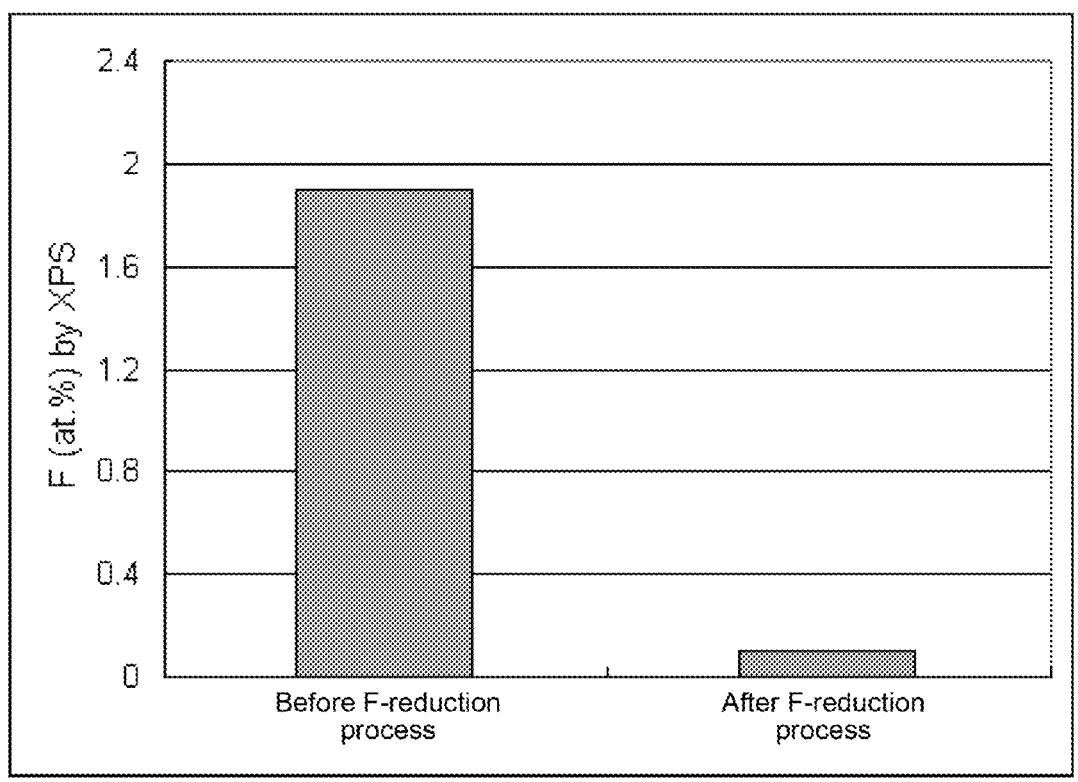
FIG. 2 shows a diagram that illustrates a fluorine concentration before a fluorine-reduction process and a fluorine concentration after the fluorine-reduction process in accordance with one or more embodiments of the present invention.
Figure 3:
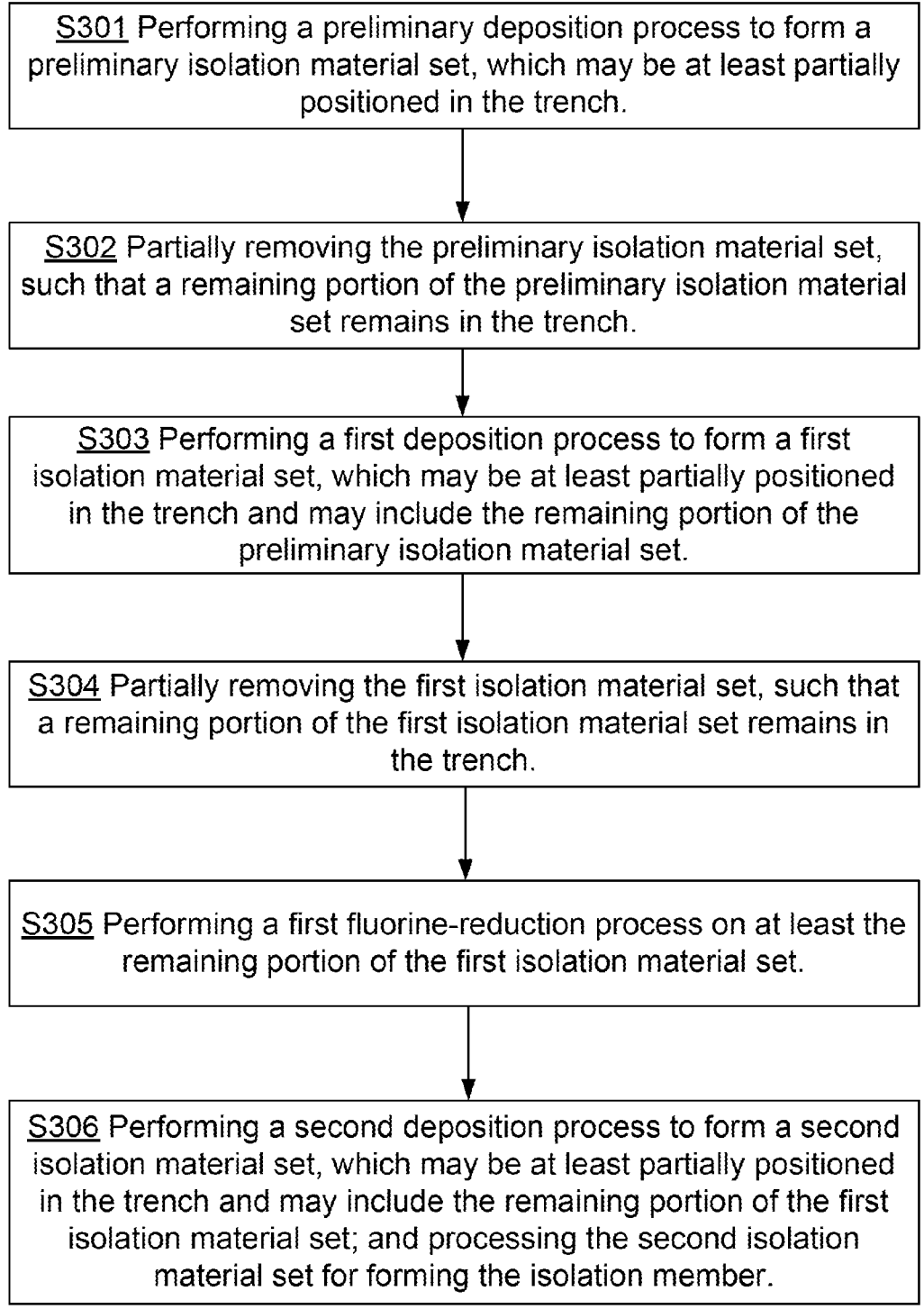
FIG. 3 shows a flowchart that illustrates steps in a method for forming an isolation member in a trench of a substrate in accordance with one or more embodiments of the present invention.

FIG. 1A, FIG. 1B, FIG. 1C, FIG. 1D, FIG. 1E, FIG. 1F, FIG. 1G, and FIG. 1H show schematic diagrams (e.g., schematic cross-sectional views) that illustrate elements and/or structures formed in a method for forming an isolation member in a trench 1001 of a substrate 100 in accordance with one or more embodiments of the present invention. FIG. 2 shows a diagram that illustrates a fluorine (F) concentration before a fluorine-reduction process and a fluorine (F) concentration after the fluorine-reduction process in accordance with one or more embodiments of the present invention. FIG. 3 shows a flowchart that illustrates steps in the method for forming an isolation member in the trench 1001 of the substrate 100 in accordance with one or more embodiments of the present invention. The resulted structure with the isolation member positioned in the trench 1001 of the substrate 100 may be used for manufacturing a semiconductor device. The isolation member may be a shallow trench isolation (STI) member and may facilitate isolation of components and/or facilitate prevention of electrical current leakage in the semiconductor device.

Referring to FIG. 3, the method may include steps S301, S302, S303, S304, S305, and S306.

Figure 1B:
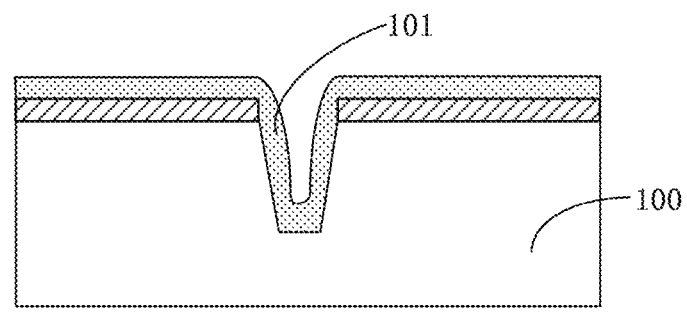

Referring to FIG. 3, FIG. 1A, and FIG. 1B, the step S301 may include performing a preliminary deposition process to form a preliminary isolation material set 101, which may be at least partially positioned in the trench 1001.

The substrate 100 may be a semiconductor substrate. The substrate 100 may be or may include one or more of a monocrystalline silicon substrate, a silicon-on-insulator (SOI) substrate, etc. A mask layer 1002 (e.g., a hard mask layer) used in a process for forming the trench 1001 may be positioned on the substrate 100. The mask layer 1002 may be formed of silicon nitride (SiN).

The preliminary deposition process may include one or more of a chemical vapor deposition (CVD) process, a physical vapor deposition (PVD) process, a high-aspect-ratio process (HARP), etc.

The preliminary isolation material set 101 may be formed of one or more dielectric materials, such as one or more of silicon oxide, etc. provided in the preliminary deposition process. The preliminary isolation material set 101 may cover the bottom and the sides of the trench 1001. A portion of the preliminary isolation material set 101 may overlap the substrate 100 and/or the mask layer 1002 in a direction perpendicular to the bottom side of the substrate 100.

Figure 1C:
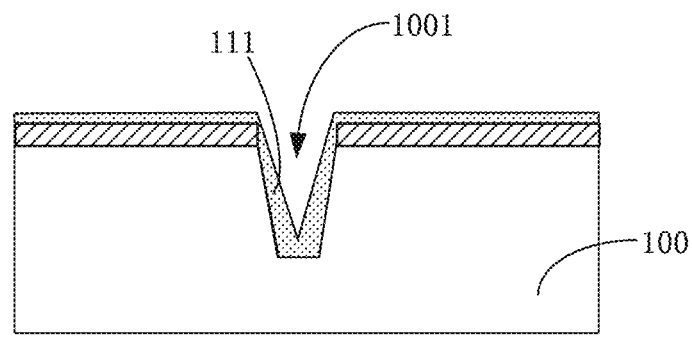

Referring to FIG. 3, FIG. 1B, and FIG. 1C, subsequent to the step S301, the step S302 may include partially removing (e.g., through etching) the preliminary isolation material set 101, such that a remaining portion 111 of the preliminary isolation material set 101 may remain in the trench 1001. The partial removal of the preliminary isolation material set 101 may facilitate subsequent deposition of isolation material (e.g., dielectric material) for minimizing voids in the formed isolation member.

The preliminary isolation material set 101 may be partially removed using a dry etching process and/or a wet etching process. The dry etching process may be, for example, a remote plasma assisted dry etching process, such as a SICONI™ etching process.

Figure 1D:
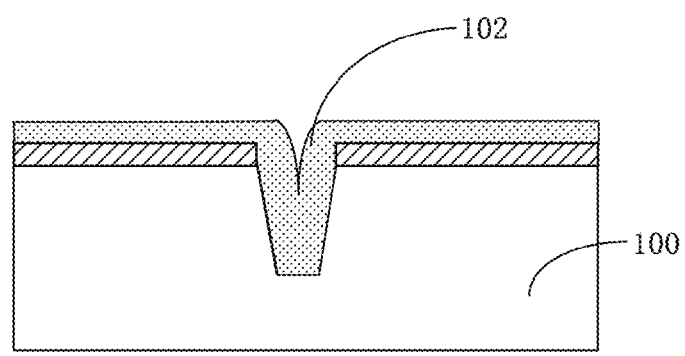

Referring to FIG. 3, FIG. 1C, and FIG. 1D, subsequent to the step S302, the step S303 may include performing a first deposition process to form a first isolation material set 102, which may be at least partially positioned in the trench and may include the remaining portion 111 of the preliminary isolation material set 101.

The first deposition process may include one or more of a chemical vapor deposition (CVD) process, a physical vapor deposition (PVD) process, a high-aspect-ratio process (HARP), etc. In an embodiment, the first deposition process may provide the same isolation material as the preliminary deposition process. In an embodiment, the first deposition process may provide an isolation material that is different from an isolation material provided in the preliminary deposition process.

In an embodiment, the method may include the following step: before performing the first deposition process, performing a preliminary fluorine-reduction process on at least the remaining portion 111 of the preliminary isolation material set 101. The preliminary fluorine-reduction process may facilitate the first deposition process.

Figure 1E:
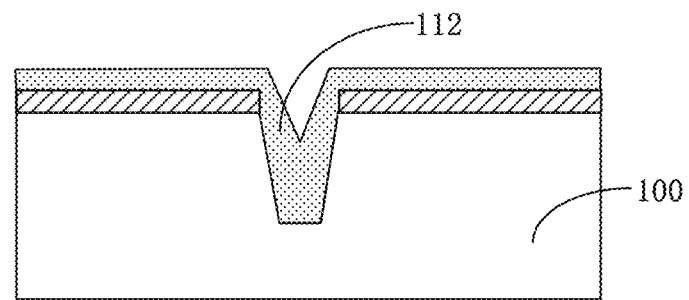
Figure 1F:
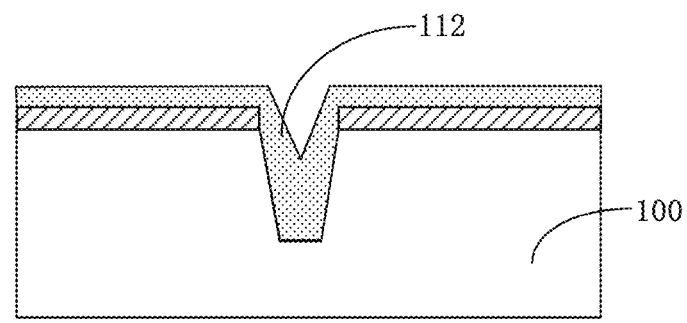
Figure 1G:
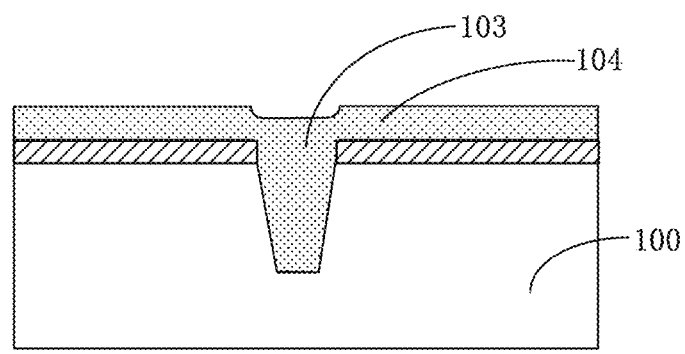
Figure 1H:
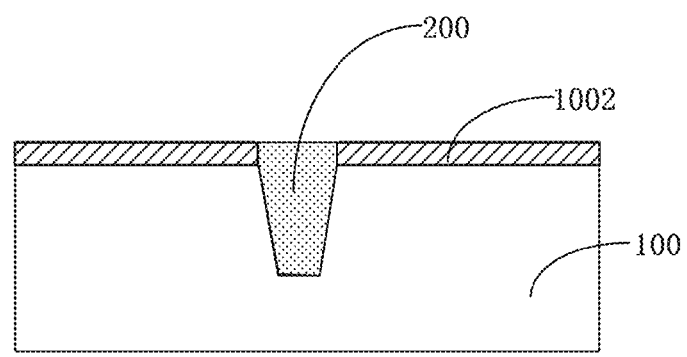

Referring to FIG. 3, FIG. 1D, and FIG. 1E, subsequent to the step S303, the step S304 may include partially removing the first isolation material set 102, such that a remaining portion 112 of the first isolation material set 102 may remain in the trench 1001. The partial removal of the first isolation material set 102 may facilitate subsequent deposition of isolation material (e.g., dielectric material) for minimizing voids in the formed isolation member.

The first isolation material set 102 may be partially removed using a dry etching process and/or a wet etching process. The dry etching process may be, for example, a remote plasma assisted dry etching process, such as a SICONI™ etching process.

Referring to FIG. 3, FIG. 1E, FIG. 1F, and FIG. 2, subsequent to the step S304, the step S305 may include performing a first fluorine-reduction process on at least the remaining portion 112 of the first isolation material set 102.

In an embodiment, the first fluorine-reduction process may include processing at least the remaining portion of the first isolation material set using ozone plasma in a reaction chamber. The ozone plasma may be provided (e.g., ignited and/or maintained) using a power that may be in a range of 350 watts to 600 watts. The ozone plasma may be provided using a power of 450 watts. The first fluorine-reduction process may be performed with the ozone plasma for a time duration that may be in a range of 1 second to 10 seconds. The first fluorine-reduction process may be performed with the ozone plasma for 3 seconds.

In an embodiment, the first fluorine-reduction process may include processing at least the remaining portion of the first isolation material set using hydrogen plasma in a reaction chamber.

The method may include the following step: after the first fluorine-reduction process has been performed, performing an X-ray photoelectron spectroscopy (XPS) process to determine a fluorine concentration on the remaining portion 112 of the first isolation material set 102.

After the first fluorine-reduction process has been performed, a fluorine concentration at a surface of the remaining portion 112 of the first isolation material set 102 may be less than 0.4 atom percent (e.g., about 0.1 atom percent).

The first fluorine-reduction process may reduce a fluorine concentration at a surface of the remaining portion 112 of the first isolation material set 102 from greater than 1.6 atom percent (e.g., about 1.9 atom percent) to less than 0.4 atom percent (e.g., about 0.1 atom percent).

The first fluorine-reduction process may advantageously facilitate subsequent deposition and planarization of isolation material.

Referring to FIG. 3, FIG. 1F, FIG. 1G, and FIG. 1H, subsequent to the step S305, the step S306 may include the following sub-steps: performing a second deposition process to form a second isolation material set 103, which may be at least partially positioned in the trench 1001 and may include the remaining portion 112 of the first isolation material set 102; and processing the second isolation material set 103 for forming the isolation member 200.

The second deposition process may include one or more of a chemical vapor deposition (CVD) process, a physical vapor deposition (PVD) process, a high-aspect-ratio process (HARP), etc. In an embodiment, the second deposition process may provide the same isolation material as at least one of the preliminary deposition process and the first deposition process. In an embodiment, the second deposition process may provide an isolation material that is different from at least one of an isolation material provided in the preliminary deposition process and an isolation material provided in the first deposition process.

The method may include the following step: before the second deposition process, performing an X-ray photoelectron spectroscopy (XPS) process to determine a fluorine concentration on the remaining portion 112 of the first isolation material set 102.

Before the second deposition process, a fluorine concentration at a surface of the remaining portion 112 of the first isolation material set 102 may be less than 0.4 atom percent (e.g., about 0.1 atom percent).

The substantially low fluorine concentration on the remaining portion 112 of the first isolation material set 102 may advantageously enable the second deposition process to be performed efficiently and may advantageously enable the structure resulted from the second deposition process to have a relatively uniform thickness, such that a subsequent planarization process may be efficiently performed on the structure.

The second deposition process further may also form a third isolation material set 104, which may be positioned away from the trench 1001, may not overlap the second isolation material set 103 in a direction perpendicular to the bottom side of the substrate 100, and may overlap the substrate 100. For example, the third isolation material set 104 may be positioned at an edge of the substrate 100. A difference between a height of a top surface of the third isolation material set 104 above the bottom side of the substrate 100 and a height of a top surface of the second isolation material set 103 above the bottom side of the substrate 100 may be less than or equal to 200 angstroms after the second deposition process has been completed.

The step S306 may include the following sub-step: performing a polishing process, e.g., a chemical-mechanical polishing (CMP) process, to partially remove the second isolation material set 103 and to completely remove the third isolation material set 104. A remaining portion of the second isolation material set may form the isolation member 200. A difference between maximum isolation material height and a minimum isolation material height above a bottom side of the substrate 100 may be less than or equal to 200 angstroms before the polishing process, such that the polishing process may be efficiently performed.

In an embodiment, in addition to the steps discussed with reference to FIGS. 1A to 3, one or more additional isolation material deposition processes, one or more additional isolation material partial removal processes, and/or one or more additional fluorine-reduction processes may be performed.

Figure 4:
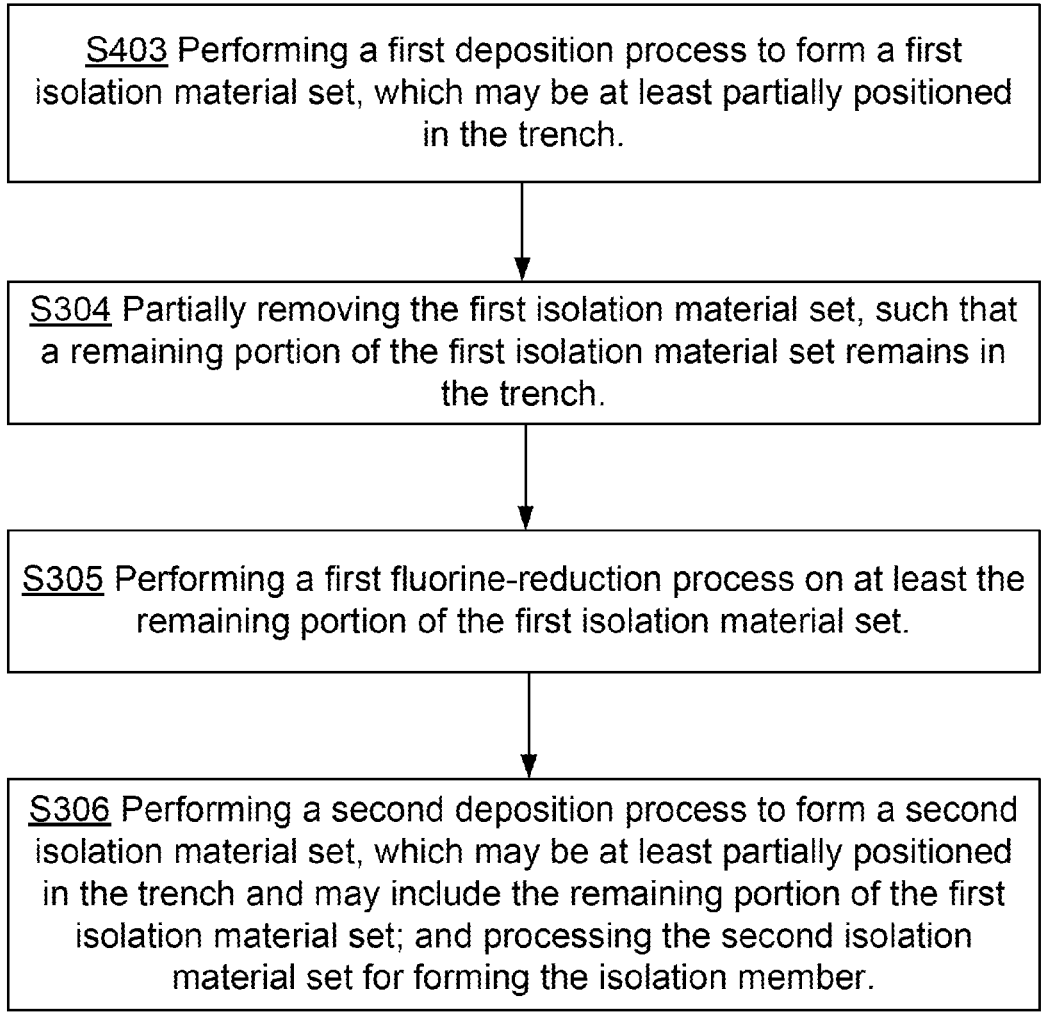
FIG. 4 shows a flowchart that illustrates steps in a method for forming an isolation member in a trench of a substrate in accordance with one or more embodiments of the present invention.

FIG. 4 shows a flowchart that illustrates steps in a method for forming an isolation member in a trench of a substrate in accordance with one or more embodiments of the present invention. The method illustrated in FIG. 4 may have one or more of the features and advantages discussed with reference to FIGS. 1A to 3.

Referring to FIG. 4, the method may include steps S403, S304, S305, and S306, which may have one or more of the features and advantages associated with the steps S303, S304, S305, and S306 discussed with reference to FIGS. 1A to 3. In an embodiment, in the step S403, the first isolation material set may not include isolation material deposited in a previous deposition process.

In an embodiment, in addition to the steps discussed with reference to FIG. 4, one or more additional isolation material deposition processes, one or more additional isolation material partial removal processes, and/or one or more additional fluorine-reduction processes may be performed.

According to embodiments of the invention, in a process for forming an isolation member in a trench of a substrate, a fluorine-reduction process may be performed before an isolation material deposition process. The fluorine-reduction process may enable the isolation material deposition process to be performed efficiently and may enable a subsequent polishing process to be performed efficiently. Advantageously, satisfactory productivity associated with the isolation member (and a related semiconductor device) may be attained.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A method for forming an isolation member in a trench of a substrate, the method comprising:

performing a first deposition process to form a first isolation material set, which is at least partially positioned in the trench;

partially removing the first isolation material set, such that a remaining portion of the first isolation material set remains in the trench;

after the first isolation material set has been partially removed, performing a first fluorine-reduction process on at least the remaining portion of the first isolation material set;

after the first fluorine-reduction process has been performed, performing a second deposition process to form a second isolation material set, which is at least partially positioned in the trench and includes the remaining portion of the first isolation material set; and performing a polishing process to partially remove the second isolation material set, such that a remaining portion of the second isolation material set forms the isolation member, wherein a difference between maximum isolation material height and a minimum isolation material height above a bottom side of the substrate is less than or equal to 200 angstroms before the polishing process.

2. The method of claim 1, further comprising:

before performing the first deposition process, performing a preliminary deposition process to form a preliminary isolation material set, which is at least partially positioned in the trench; and before performing the first deposition process, partially removing the preliminary isolation material set, such that a remaining portion of the preliminary isolation material set remains in the trench, wherein the first isolation material set includes the remaining portion of the preliminary isolation material set.

3. The method of claim 2, further comprising:

before performing the first deposition process, performing a preliminary fluorine-reduction process on at least the remaining portion of the preliminary isolation material set.

4. The method of claim 2, wherein the preliminary deposition process provides a first-type dielectric material, and wherein the first deposition process provides the first-type dielectric material.

5. The method of claim 1, wherein the first fluorine-reduction process includes processing at least the remaining portion of the first isolation material set using ozone plasma.

6. The method of claim 5, wherein the ozone plasma is provided using a power that is in a range of 350 watts to 600 watts.

7. The method of claim 5, wherein the ozone plasma is provided using a power of 450 watts.

8. The method of claim 5, wherein the first fluorine-reduction process is performed for a time duration that is in a range of 1 second to 10 seconds.

9. The method of claim 5, wherein the first fluorine-reduction process is performed for 3 seconds.

10. The method of claim 1, wherein the first fluorine-reduction process includes processing at least the remaining portion of the first isolation material set using hydrogen plasma.

11. The method of claim 1, further comprising: after the first fluorine-reduction process has been performed, performing an X-ray photoelectron spectroscopy process to determine a fluorine concentration on the remaining portion of the first isolation material set.

12. The method of claim 1, wherein after the first fluorine-reduction process has been performed, a fluorine concentration at a surface of the remaining portion of the first isolation material set is less than 0.4 atom percent.

13. The method of claim 1, wherein before the second deposition process, a fluorine concentration at a surface of the remaining portion of the first isolation material set is less than 0.4 atom percent.

14. The method of claim 1, wherein the first fluorine-reduction process reduces a fluorine concentration at a surface of the remaining portion of the first isolation material set from greater than 1.6 atom percent to less than 0.4 atom percent.

15. The method of claim 1, wherein the first deposition process provides a first-type dielectric material, and wherein the second deposition process provides the first-type dielectric material.

16. The method of claim 1, wherein the first isolation material set is partially removed using a remote plasma assisted dry etching process.

17. The method of claim 1, wherein the first deposition process is a high-aspect-ratio process.

18. A method for forming an isolation member in a trench of a substrate, the method comprising:

performing a first deposition process to form a first isolation material set, which is at least partially positioned in the trench;

partially removing the first isolation material set, such that a remaining portion of the first isolation material set remains in the trench;

after the first isolation material set has been partially removed, performing a first fluorine-reduction process on at least the remaining portion of the first isolation material set;

after the first fluorine-reduction process has been performed, performing a second deposition process to form a second isolation material set, which is at least partially positioned in the trench and includes the remaining portion of the first isolation material set, wherein the second deposition process further forms a third isolation material set, which is positioned away from the trench and overlaps the substrate, and wherein a difference between a height of a top surface of the third isolation material set above a bottom side of the substrate and a height of a top surface of the second isolation material set above the bottom side of the substrate is less than or equal to 200 angstroms after the second deposition process has been completed; and processing the second isolation material set for forming the isolation member.

19. The method of claim 18, comprising: performing a polishing process to partially remove the second isolation material set and to completely remove the third isolation material set, wherein a remaining portion of the second isolation material set forms the isolation member.

* * * * *